United States Patent
Saito et al.

(10) Patent No.: US 9,706,651 B2
(45) Date of Patent: Jul. 11, 2017

(54) RESIN COMPOSITION, PREPREG, AND LAMINATE

(71) Applicant: MITSUBISHI GAS CHEMICAL COMPANY, INC., Tokyo (JP)

(72) Inventors: Chisato Saito, Tokyo (JP); Masanobu Sogame, Tokyo (JP); Yoshinori Mabuchi, Tokyo (JP); Yoshihiro Kato, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 313 days.

(21) Appl. No.: 14/362,200

(22) PCT Filed: Nov. 30, 2012

(86) PCT No.: PCT/JP2012/081100
§ 371 (c)(1),
(2) Date: Jun. 2, 2014

(87) PCT Pub. No.: WO2013/084819
PCT Pub. Date: Jun. 13, 2013

(65) Prior Publication Data
US 2014/0329066 A1    Nov. 6, 2014

(30) Foreign Application Priority Data
Dec. 7, 2011 (JP) ................................. 2011-267935

(51) Int. Cl.
| | | |
|---|---|---|
| H05K 1/03 | (2006.01) | |
| H05K 1/05 | (2006.01) | |
| B32B 15/092 | (2006.01) | |
| C08L 61/14 | (2006.01) | |
| C08J 5/24 | (2006.01) | |
| C08L 63/00 | (2006.01) | |
| C08G 59/40 | (2006.01) | |
| B32B 15/14 | (2006.01) | |

(52) U.S. Cl.
CPC ........... H05K 1/0373 (2013.01); B32B 15/14 (2013.01); C08G 59/4007 (2013.01); C08J 5/24 (2013.01); C08L 63/00 (2013.01); H05K 1/056 (2013.01); B32B 2260/023 (2013.01); B32B 2260/046 (2013.01); B32B 2305/076 (2013.01); B32B 2457/08 (2013.01); C08J 2363/00 (2013.01); H05K 2201/012 (2013.01); H05K 2201/0209 (2013.01); Y10T 428/24802 (2015.01); Y10T 428/24917 (2015.01); Y10T 428/31515 (2015.04); Y10T 428/31522 (2015.04)

(58) Field of Classification Search
USPC .................... 428/209, 416, 460; 523/424
See application file for complete search history.

(56) References Cited

U.S. PATENT DOCUMENTS

| | | | |
|---|---|---|---|
| 3,562,214 A | | 2/1971 | Kubens et al. |
| 4,631,319 A | * | 12/1986 | Blahak .................. C08G 18/83 |
| | | | 525/32.1 |
| 4,745,215 A | | 5/1988 | Cox et al. |
| 4,831,086 A | | 5/1989 | Das et al. |
| 4,904,760 A | | 2/1990 | Gaku et al. |
| 4,978,727 A | | 12/1990 | Das et al. |
| 5,194,331 A | | 3/1993 | Das et al. |
| 5,360,887 A | | 11/1994 | Tsunemi et al. |
| 5,468,790 A | | 11/1995 | Papathomas |
| 6,931,050 B1 | | 8/2005 | Bottomley |
| 2003/0130412 A1 | | 7/2003 | Mizuno et al. |
| 2005/0182203 A1 | | 8/2005 | Sugano et al. |
| 2006/0084787 A1 | | 4/2006 | Sugano et al. |
| 2006/0167189 A1 | | 7/2006 | Mizuno et al. |
| 2007/0238850 A1 | | 10/2007 | Ogiwara et al. |
| 2009/0017316 A1 | | 1/2009 | Kato et al. |
| 2011/0194261 A1 | | 8/2011 | Tanaka et al. |
| 2013/0281640 A1 | | 10/2013 | Tsubuku et al. |
| 2014/0308530 A1 | * | 10/2014 | Sugano ..................... C08J 5/24 |
| | | | 428/460 |

FOREIGN PATENT DOCUMENTS

| | | |
|---|---|---|
| CN | 101128501 | 2/2008 |
| CN | 101735108 | 6/2010 |
| CN | 101948408 | 1/2011 |
| EP | 0 324 908 | 7/1989 |
| EP | 1852451 | 11/2007 |
| EP | 2 055 728 | 5/2009 |
| JP | 52154857 | 12/1977 |
| JP | 63-250359 | 10/1988 |
| JP | 1-158039 | 6/1989 |
| JP | 2-214763 | 8/1990 |
| JP | 2-286723 | 11/1990 |
| JP | 4-024370 | 4/1992 |
| JP | 4-507110 | 12/1992 |
| JP | 05-222148 | 8/1993 |
| JP | 6-049238 | 2/1994 |

(Continued)

OTHER PUBLICATIONS

Database WPI Week 197806, Thomson Scientific, London BG; AN 1978-11136A, XP002733686A, & JP S52 154857 (Mitsubishi Gas Chem. Ind. Co., Ltd.) Dec. 22, 1977, Abstract.
International Search Report issued Mar. 5, 2013 in PCT/JP2012/081100 and English version thereof.

*Primary Examiner* — Tae H Yoon
(74) *Attorney, Agent, or Firm* — Greenblum & Bernstein, P.L.C.

(57) ABSTRACT

To provide a prepreg resin composition which has good solubility in a solvent and with which moreover a cured product having excellent flame resistance and a low water absorption rate can be made simply and with good reproducibility, and a prepreg and a laminate and a printed wiring board and the like using the same. The prepreg resin composition of the present invention including at least a cyanate compound (A) obtained by cyanation of a phenol-modified xylene formaldehyde resin, an epoxy resin (B), and an inorganic filler.

8 Claims, No Drawings

(56) References Cited

FOREIGN PATENT DOCUMENTS

| | | |
|---|---|---|
| JP | 6-122763 | 5/1994 |
| JP | 6-228308 | 8/1994 |
| JP | 7-207022 | 8/1995 |
| JP | 09-052941 | 2/1997 |
| JP | 11-124433 | 5/1999 |
| JP | 2000-095938 | 4/2000 |
| JP | 2000-191776 | 7/2000 |
| JP | 2001-339130 | 12/2001 |
| JP | 2002-206048 | 7/2002 |
| JP | 2002-531989 | 9/2002 |
| JP | 2003-128753 | 5/2003 |
| JP | 2003-128784 | 5/2003 |
| JP | 2003-128928 | 5/2003 |
| JP | 2004-175925 | 6/2004 |
| JP | 2004-182850 | 7/2004 |
| JP | 2005-264154 | 9/2005 |
| JP | 2009-35728 | 2/2009 |
| JP | 2010-174242 | 8/2010 |
| JP | 2011-178992 | 9/2011 |
| WO | 90/01514 | 2/1990 |
| WO | 2004-029127 | 4/2004 |
| WO | 2012/057144 | 5/2012 |

\* cited by examiner

RESIN COMPOSITION, PREPREG, AND LAMINATE

This application is a 371 national phase of International Application No. PCT/JP2012/081100, filed Nov. 30, 2012, which claims priority from Japanese Application No. 2011-267935, filed Dec. 7, 2011. The entire disclosures of each of these applications are incorporated herein by reference in their entirety for all purposes.

TECHNICAL FIELD

The present invention relates to a resin composition used in a prepreg for a printed wiring board, and a prepreg and a laminate using the same.

BACKGROUND ART

In printed wiring boards widely used in electronic equipment, communication instruments, personal computers, and the like, higher density wiring and higher integration progress. With this, excellent characteristics such as heat resistance, low water absorbency, moisture absorption and heat resistance properties, dielectric characteristics, and peel strength are required of metal foil-clad laminates used in printed wiring boards.

On the other hand, cyanate compounds have been known for a long time as raw materials of thermosetting resins having excellent moisture absorption and heat resistance properties, dielectric characteristics, and the like. In recent years, thermosetting resin compositions containing cyanate compounds have been widely used as materials for high function printed wiring boards, such as for semiconductor plastic packages, and the like because cured products having excellent characteristics in electrical characteristics, mechanical characteristics, chemical resistance, adhesiveness, and the like are relatively easily obtained.

For example, thermosetting resin compositions containing bisphenol A-based cyanate compounds are well known. However, cured products thereof may be insufficient in terms of low water absorbency and flame resistance under severe conditions. Therefore, with the aim of further improving characteristics, thermosetting resin compositions using cyanate compounds having other structures are studied.

As those using cyanate compounds having other structures, thermosetting resin compositions containing phenol novolac-based cyanate having a number average molecular weight of 260 to 450 (see Patent Literature 1), thermosetting resin compositions containing a copolymer of bisphenol A-based cyanate and novolac-based cyanate (see Patent Literature 2), and the like are known.

In addition, thermosetting resin compositions containing phenol-modified cyanate oligomers obtained by reacting cyanate compounds with phenol compounds (see Patent Literature 3), thermosetting resin compositions containing biphenyl aralkyl-based cyanate compounds (see Patent Literature 4), and the like are known.

CITATION LIST

Patent Literature

Patent Literature 1: Japanese Patent Laid-Open No. H11-124433
Patent Literature 2: Japanese Patent Laid-Open No. 2000-191776
Patent Literature 3: Japanese Patent Laid-Open No. 2001-339130
Patent Literature 4: Japanese Patent Laid-Open No. 2010-174242

SUMMARY OF INVENTION

Technical Problem

However, when a novolac-based cyanate compound is used, problems are that insufficient curing is likely to be caused under usual curing conditions, and the water absorption rate and moisture absorption and heat resistance properties are likely to be insufficient in the obtained cured product. On the other hand, when the phenol-modified cyanate oligomer in the above Patent Literature 3 is used, a problem is that the water absorption rate is still insufficient in the obtained cured product. On the other hand, the biphenyl aralkyl-based cyanate compound in the above Patent Literature 4 originally has poor solubility in a solvent, and therefore, there is a large problem with its industrial use.

The present invention has been made in view of the above problems, and it is an object of the present invention to provide a prepreg resin composition which has good solubility in a solvent and with which moreover a cured product having excellent flame resistance and a low water absorption rate can be made simply and with good reproducibility. It is another object of the present invention to provide a prepreg and a laminate and a printed wiring board and the like having excellent flame resistance, a low water absorption rate, and excellent handling properties and productivity.

Solution to Problem

The present inventors have studied diligently for solving such problems, and, as a result, found that a resin composition containing a cyanate compound obtained by cyanation of a phenol-modified xylene formaldehyde resin, an epoxy resin, and an inorganic filler has good solubility in a solvent, and a cured product thereof has excellent flame resistance and a low water absorption rate, leading to the completion of the present invention.

Specifically, the present invention provides the following <1> to <12>.

<1> A prepreg resin composition comprising at least a cyanate compound (A) obtained by cyanation of a phenol-modified xylene formaldehyde resin, an epoxy resin (B), and an inorganic filler (C).

<2> The prepreg resin composition according to <1>, wherein the cyanate compound (A) has a structure represented by the following general formula (I):

[Formula 1]

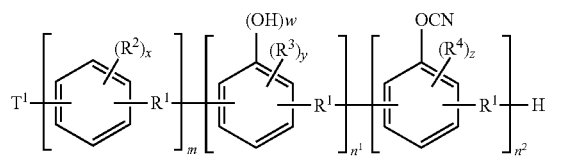

wherein $R^1$ each independently represents a methylene group, a methyleneoxy group, a methyleneoxymethylene group, or an oxymethylene group, $R^2$ to $R^4$ each independently represent a hydrogen atom, an alkyl group having 1 to 3 carbon atoms, a hydroxyl group, or a hydroxymethylene group, $T^1$ represents a hydrogen atom, a hydroxyl group, or a hydroxymethylene group, x each independently represents an integer of 0 to 4, y and z each independently represent an integer of 0 to 3, w represents an integer of 0 or 1, m represents an integer of 0 or more, and $n^1$ and $n^2$ each independently represent an integer of 1 or more.

<3> The prepreg resin composition according to <1> or <2>, wherein the epoxy resin (B) is a biphenyl aralkyl-based epoxy resin represented by the following general formula (10) and/or an epoxy resin having a naphthalene skeleton represented by the following general formula (11),

[Formula 2]

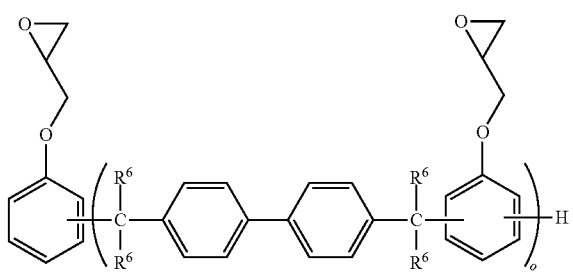

(10)

wherein $R^6$ each independently represents a hydrogen atom or a methyl group, and o represents an integer of 1 to 50,

[Formula 3]

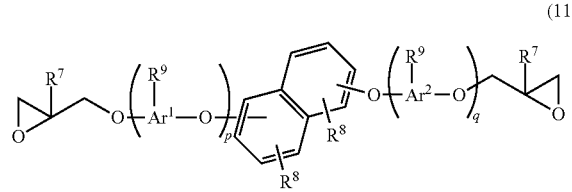

(11)

wherein $R^7$ each independently represents a hydrogen atom or a methyl group, $Ar^1$ and $Ar^2$ each independently represent a naphthylene group or a phenylene group, and both groups may each have an alkyl group having 1 to 4 carbon atoms or a phenylene group as a substituent; $R^8$ each independently represents a hydrogen atom, an alkyl group having 1 to 4 carbon atoms, or an aralkyl group represented by the following general formula (12), p and q are each independently an integer of 0 to 4 provided that either one of p and q is 1 or more, and $R^9$ each independently represents a hydrogen atom, an aralkyl group represented by the following general formula (12), or an epoxy group-containing aromatic hydrocarbon group represented by the following general formula (13); and in the above general formula (11), a bonding position to a naphthalene structure site may be either of two benzene rings constituting the naphthalene structure site,

[Formula 4]

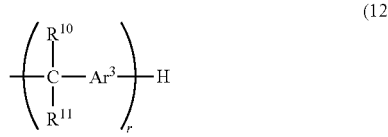

(12)

wherein $R^{10}$ and $R^{11}$ each independently represent a hydrogen atom or a methyl group, and $Ar^a$ represents a phenylene group, a phenylene group in which 1 to 3 hydrogen atoms are each replaced by an alkyl group having 1 to 4 carbon atoms, a naphthylene group, or a naphthylene group in which 1 to 3 hydrogen atoms are each replaced by an alkyl group having 1 to 4 carbon atoms; and r is a number of 0.1 to 4 on average,

[Formula 5]

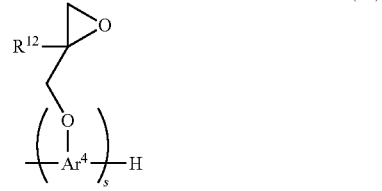

(13)

wherein $R^{12}$ represents a hydrogen atom or a methyl group, $Ar^4$ represents a naphthylene group or a naphthylene group having an alkyl group having 1 to 4 carbon atoms, an aralkyl group, or a phenylene group as a substituent, and s is an integer of 1 or 2.

<4> The prepreg resin composition according to any one of <1> to <3>, wherein the inorganic filler (C) is silica.

<5> The prepreg resin composition according to any one of <1> to <4>, wherein 30 to 70 parts by mass of the cyanate compound (A) is contained based on 100 parts by mass of a total of the (A) component and the (B) component.

<6> The prepreg resin composition according to any one of <1> to <5>, wherein 30 to 70 parts by mass of the epoxy resin (B) is contained based on 100 parts by mass of the total of the (A) component and the (B) component.

<7> The prepreg resin composition according to any one of <1> to <6>, wherein 10 to 300 parts by mass of the inorganic filler (C) is contained based on 100 parts by mass of the total of the (A) component and the (B) component.

<8> A prepreg obtained by impregnating or coating a substrate with the prepreg resin composition according to any one of <1> to <7>.

<9> A laminate comprising a plurality of the prepregs according to <8> that are laminated.

<10> A metal foil-clad laminate comprising the prepreg according to <8> and metal foil laminated on the prepreg.

<11> A printed wiring board comprising the laminate according to <10>.

<12> A printed wiring board comprising an insulating layer and a conductor layer formed on a surface of the insulating layer, wherein
the insulating layer comprises the prepreg resin composition according to any one of <1> to <7>.

Advantageous Effects of Invention

The present invention realizes a prepreg resin composition which has good solubility in a solvent and with which moreover a cured product, a laminate, and the like having excellent flame resistance and low water absorbency can be made simply and with good reproducibility. A prepreg and a laminate and a printed wiring board and the like obtained using such a prepreg resin composition are preferred as a printed wiring board addressing higher density because of high flame resistance and low water absorbency, and have extremely high industrial practicality because of excellent handling properties and productivity.

DESCRIPTION OF EMBODIMENTS

Embodiments of the present invention will be described below. The following embodiments are illustrations for explaining the present invention, and the present invention is not limited only to the embodiments.

A resin composition in this embodiment comprises at least a cyanate compound (A) obtained by cyanation of a phenol-modified xylene formaldehyde resin, an epoxy resin (B), and an inorganic filler (C).

The cyanate compound (A) used in the resin composition in this embodiment is obtained by cyanation of the hydroxyl group of a phenol-modified xylene formaldehyde resin. By cyanation of a phenol-modified xylene formaldehyde resin in this manner, a novel cyanate compound (A) having good solubility in a solvent is obtained. In addition, by using this cyanate compound (A), the curability of the resin composition is enhanced, and a cured product having excellent flame resistance can be obtained.

The phenol-modified xylene formaldehyde resin that is a raw material of the above cyanate compound (A) in this embodiment is obtained by phenol-modifying a xylene formaldehyde resin. Here, the xylene formaldehyde resin is an aromatic hydrocarbon formaldehyde resin obtained by reacting (meta)xylene with formaldehyde under an acidic catalyst. In addition, phenol-modified means those modified using phenols (a compound having a phenolic hydroxyl group) herein.

Phenol modification of the xylene formaldehyde resin can be performed according to a method known in the industry, and the method is not particularly limited. For example, a phenol-modified xylene formaldehyde resin can be obtained by reacting a xylene formaldehyde resin with phenols in the presence of an acidic catalyst. As the acidic catalyst, for example, an inorganic acid, such as sulfuric acid, hydrochloric acid, or phosphoric acid, an organic acid, such as oxalic acid, malonic acid, succinic acid, adipic acid, sebacic acid, citric acid, fumaric acid, maleic acid, formic acid, para-toluenesulfonic acid, methanesulfonic acid, trifluoroacetic acid, dichloroacetic acid, trichloroacetic acid, trifluoromethanesulfonic acid, benzenesulfonic acid, naphthalenesulfonic acid, or naphthalenedisulfonic acid, a Lewis acid, such as zinc chloride, aluminum chloride, iron chloride, or boron trifluoride, or an solid acid, such as silicotungstic acid, phosphotungstic acid, silicomolybdic acid, or phosphomolybdic acid, can be preferably used. In addition, the reaction temperature is generally preferably 50° C. to 200° C. After completion of the reaction, the target material can be recovered by performing neutralization of the acidic catalyst, dilution with an organic solvent, such as methyl ethyl ketone or meta-xylene, water washing, extraction, distillation, distilling off of the unreacted phenols, and the like according to an ordinary method.

The phenols used for the above phenol modification are not particularly limited as long as it is a compound having a phenolic hydroxyl group (generally a compound in which a hydroxyl group is bonded to an aromatic ring, such as a benzene ring). For example, phenols represented by the following general formula (1) is preferably used.

[Formula 6]

$$\underset{Ar-OH}{\overset{R}{|}} \quad (I)$$

wherein Ar represents an aromatic ring, R represents all hydrogen atoms or monovalent substituents on the aromatic ring, the monovalent substituent is an alkyl group or an aryl group, and a plurality of Rs present on the aromatic ring may be the same or different provided that at least one of Rs is a hydrogen atom.

In the above general formula (1), examples of the aromatic ring include, but are not particularly limited to, a benzene ring, a naphthalene ring, and an anthracene ring. In addition, examples of the alkyl group of R include, but are not particularly limited to, linear or branched alkyl groups having 1 to 8 carbon atoms, more preferably linear or branched alkyl groups having 1 to 4 carbon atoms, for example, a methyl group, an ethyl group, a propyl group, an isopropyl group, a butyl group, a sec-butyl group, and a tert-butyl group. Further, examples of the aryl group of R include, but are not particularly limited to, a phenyl group, a p-tolyl group, a naphthyl group, and an anthryl group. Among these, for the phenols represented by the following general formula (1), those in which Ar is a benzene ring, and R is zero to three alkyl groups, and those in which Ar is a benzene ring, and R is zero to two aryl groups are preferred.

Specific examples of the phenol represented by the above general formula (1) include phenol, 2,6-xylenol, naphthol, and biphenol. Among these, phenol and 2,6-xylenol are preferred in terms of handling.

The main product of the phenol-modified xylene formaldehyde resin obtained after the reaction is one in which the aromatic rings (for example, benzene rings) of the xylene and the phenols are bonded to each other via a methylene group that is formed from the formaldehyde during the reaction. The phenol-modified xylene formaldehyde resin obtained after the reaction is obtained as a mixture of many compounds because the positions where the formaldehyde is bonded to the aromatic rings of the xylene and the phenols, the position where the phenols are bonded, the degree of polymerization, and the like are not the same. For example, a phenol-modified xylene formaldehyde resin obtained by refluxing a water solvent for 7 hours with xylene, an aqueous formalin solution, 2,6-xylenol, and concentrated sulfuric acid in a nitrogen gas flow, and then neutralizing the acid followed by extraction with an organic solvent is a mixture containing compounds represented by the following formulas (2) to (5) as a typical composition.

[Formula 7]

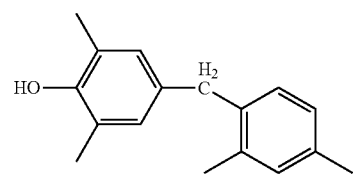
(2)

[Formula 8]

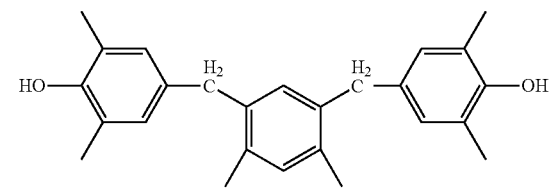
(3)

[Formula 9]

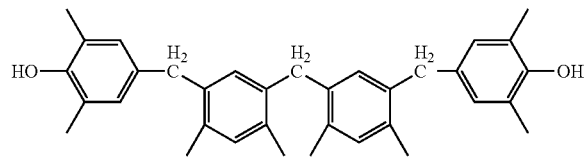

(4)

[Formula 10]

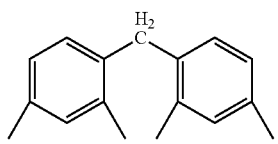

(5)

Among these, the aromatic hydrocarbon compound having no hydroxyl group in the structure like the above formula (5) is preferably previously removed by distillation separation or the like because it cannot be cyanated.

In terms of further enhancing handling properties and further enhancing the properties, such as dielectric constant, dielectric loss tangent, flame retardancy, and heat resistance, of the obtained curable resin composition and cured product, the phenol-modified xylene formaldehyde resin preferably has an OH value of 150 to 400 mg KOH/g, more preferably 200 to 350 mg KOH/g, as obtained based on JISK1557-1.

For the phenol-modified xylene formaldehyde resin, commercial products can also be used. As the commercial products, for example, NIKANOL GL16 and NIKANOL G manufactured by Fudow Company Limited are preferably used. In addition, one cyanate compound (A) can be used alone, or two or more cyanate compounds (A) can be used in appropriate combination according to the purpose.

The cyanate compound (A) in this embodiment can be obtained by cyanation of the hydroxyl groups of the above phenol-modified xylene formaldehyde resin. The synthesis method is not particularly limited, and known methods can be applied. For example, the cyanate compound (A) can be obtained by cyanation of the hydroxyl groups of a phenol-modified xylene formaldehyde resin by a method described in IAN HAMERTON, "Chemistry and Technology of Cyanate Ester Resins," BLACKIE ACADEMIC & PROFESSIONAL. In addition, a method of reacting in a solvent in the presence of a base such that a cyanogen halide is always present in excess of the base (U.S. Pat. No. 3,553,244), a method of synthesizing using a tertiary amine as a base in excess of a cyanogen halide (Japanese Patent Laid-Open No. 7-53497), a method of reacting a trialkylamine with a cyanogen halide in a continuous plug flow mode (National Publication of International Patent Application No. 2000-501138), a method of treating, with a cation and anion exchange pair, a tert-ammonium halide produced as a by-product in reacting phenol with a cyanogen halide in a nonaqueous solution in the presence of a tert-amine (National Publication of International Patent Application No. 2001-504835), a method of reacting a phenol-modified xylene formaldehyde resin in the presence of a solvent separable from water by simultaneously adding a tertiary amine and a cyanogen halide, followed by water washing and separation, and precipitation and purification from the obtained solution using a poor solvent of a secondary or tertiary alcohol or a hydrocarbon (Japanese Patent No. 2991054), and further, a method of reacting a phenol-modified xylene formaldehyde resin, a cyanogen halide, and a tertiary amine in a two-phase solvent of water and an organic solvent under acidic conditions (Japanese Patent Laid-Open No. 2007-277102), and the like are known. The above cyanate compound (A) can be obtained preferably using these known methods. The obtained cyanate compound (A) can be identified by a known method, such as NMR.

As a specific illustration, by reacting a 2,6-xylenol-modified xylene formaldehyde resin represented by the above general formulas (2) to (4) with cyanogen chloride in a solvent in the presence of a basic compound, a cyanate (mixture) containing compounds represented by the following general formulas (6) to (8) as a typical composition can be obtained.

[Formula 11]

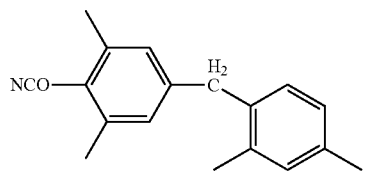

(6)

[Formula 12]

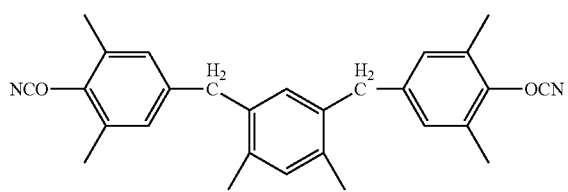

(7)

[Formula 13]

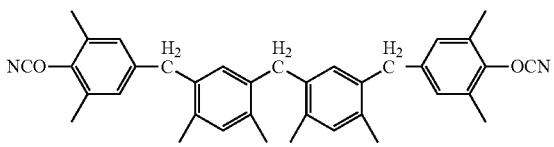

(8)

Particularly, the cyanate compound (A) represented by the following general formula (I) is preferred in terms of curability and flame resistance.

[Formula 14]

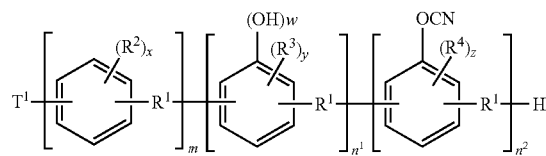

(I)

wherein $R^1$ each independently represents a methylene group, a methyleneoxy group, a methyleneoxymethylene group, or an oxymethylene group, $R^2$ to $R^4$ each independently represent a hydrogen atom, an alkyl group having 1 to 3 carbon atoms (preferably a methyl group), a hydroxyl group, or a hydroxymethylene group, $T^1$ represents a hydrogen atom, a hydroxyl group, or a hydroxymethylene group, x each independently represents an integer of 0 to 4 (preferably an integer of 0 to 2), y and z each independently represent an integer of 0 to 3 (preferably an integer of 0 to 2), w represents an integer of 0 or 1, m represents an integer of 0 or more, and $n^1$ and $n^2$ each independently represent an integer of 1 or more.

In the above general formula (I), m, $n^1$, and $n^2$ represent the ratio of constituent units, and the arrangement of repeating units is arbitrary. In other words, the compound of the above general formula (I) may be a random copolymer or a block copolymer (the same applies to all the ratios of constituent units herein). In addition, the compound of the above general formula (I) may be crosslinked and linked by two or more of $R^1$. The upper limit value of m is usually 50 or less, preferably 20 or less, and the upper limit values of $n^1$ and $n^2$ are each usually 20 or less.

The weight average molecular weight Mw of the above cyanate compound (A) is not particularly limited, and is preferably 250 to 10,000, more preferably 300 to 5,000.

The content of the cyanate compound (A) in the resin composition in this embodiment can be appropriately set according to the target application and performance, and is not particularly limited. In terms of the solvent solubility and heat resistance of the resin composition, and the like, the content of the cyanate compound (A) is preferably 10 to 90 parts by mass, more preferably 30 to 70 parts by mass, based on 100 parts by mass of the total of the cyanate compound (A) and the epoxy resin (B).

The resin composition in this embodiment may contain a cyanate compound other than the above-described cyanate compound (A) (hereinafter referred to also as "another cyanate compound"). As the another cyanate compound, a known one can be appropriately used as long as it is a compound represented by the general formula R—O—CN, wherein R is an organic group. The type of the another cyanate compound is not particularly limited. Specific examples thereof include, but are not particularly limited to, bisphenol A-based cyanate compounds, bisphenol F-based cyanate compounds, bisphenol M-based cyanate compounds, bisphenol P-based cyanate compounds, bisphenol E-based cyanate compounds, phenol novolac-based cyanate compounds, cresol novolac-based cyanate compounds, dicyclopentadiene novolac-based cyanate compounds, tetramethyl bisphenol F-based cyanate compounds, biphenol-based cyanate compounds, phenol aralkyl-based cyanate compounds, xylenol aralkyl-based cyanate compounds, naphthol aralkyl-based cyanate compounds, and prepolymers thereof. One of these can be used alone, or two or more of these can be used in appropriate combination according to the purpose.

As the epoxy resin (B) used in the resin composition in this embodiment, a known one can be appropriately used as long as it has two or more epoxy groups in one molecule. The type of the epoxy resin (B) is not particularly limited. Because of enhanced interest in environmental problems in recent years, non-halogen-based epoxy resins are preferred. Specific examples thereof include, but are not particularly limited to, bisphenol A-based epoxy resins, bisphenol E-based epoxy resins, bisphenol F-based epoxy resins, bisphenol S-based epoxy resins, phenol novolac-based epoxy resins, cresol novolac-based epoxy resins, biphenyl-based epoxy resins, bisphenol A novolac-based epoxy resins, trifunctional phenol-based epoxy resins, tetrafunctional phenol-based epoxy resins, glycidyl ester-based epoxy resins, naphthalene-based epoxy resins, anthracene-based epoxy resins, biphenyl-based epoxy resins, phenol aralkyl-based epoxy resins, aralkyl novolac-based epoxy resins, alicyclic epoxy resins, biphenyl aralkyl-based epoxy resins, naphthol aralkyl-based epoxy resins, dicyclopentadiene-based epoxy resins, polyol-based epoxy resins, glycidyl amines, glycidyl esters, compounds obtained by epoxidizing the double bond of butadiene or the like, and compounds obtained by reaction of hydroxyl group-containing silicone resins with epichlorohydrin. Among these, in terms of excellent heat resistance and excellent characteristics such as water absorbency and moisture absorption and heat resistance properties, bisphenol A-based epoxy resins, bisphenol F-based epoxy resins, phenol novolac-based epoxy resins, cresol novolac-based epoxy resins, bisphenol A novolac-based epoxy resins, brominated bisphenol A-based epoxy resins, brominated phenol novolac-based epoxy resins, biphenyl-based epoxy resins, phenol aralkyl-based epoxy resins, biphenyl aralkyl-based epoxy resins, and naphthol aralkyl-based epoxy resins are preferred, and phenol aralkyl-based epoxy resins, biphenyl aralkyl-based epoxy resins, and naphthol aralkyl-based epoxy resins are more preferred. One of these epoxy resins (B) can be used alone, or two or more of these epoxy resins (B) can be used in appropriate combination according to the purpose.

Among these, aralkyl novolac-based epoxy resins are preferred as the epoxy resin (B) in terms of improving the flame retardancy of the obtained cured product, laminate, and the like. Among the aralkyl novolac-based epoxy resins, particularly, a biphenyl aralkyl-based epoxy resin represented by the following general formula (10) is preferred. Examples of products of the epoxy resin represented by the following general formula (10) include NC-3000-FH manufactured by Nippon Kayaku Co., Ltd.

[Formula 15]

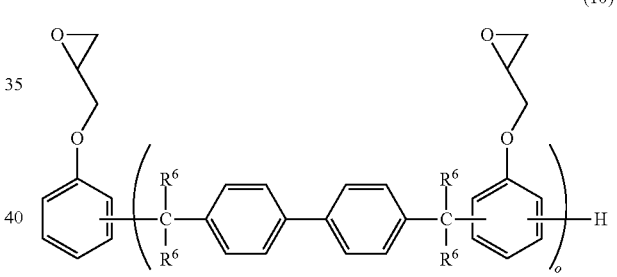

wherein $R^6$ each independently represents a hydrogen atom or a methyl group, and o represents an integer of 1 to 50.

On the other hand, in terms of decreasing a thermal expansion coefficient, an epoxy resin having a naphthalene skeleton represented by the following general formula (11) is preferred. Examples of products of the epoxy resin having a naphthalene skeleton represented by the following general formula (11) include HP-6000 manufactured by DIC Corporation, EXA-7310 manufactured by DIC Corporation, EXA-7311 manufactured by DIC Corporation, EXA-7311-L manufactured by DIC Corporation, EXA-7311-G3 manufactured by DIC Corporation, and EXA-7311-G4 manufactured by DIC Corporation.

[Formula 16]

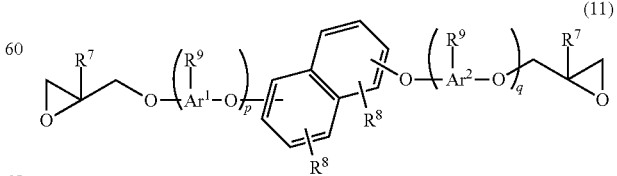

wherein $R^7$ each independently represents a hydrogen atom or a methyl group, $Ar^1$ and $Ar^2$ each independently represent a naphthylene group or a phenylene group, and both groups may each have an alkyl group having 1 to 4 carbon atoms or a phenylene group as a substituent; $R^8$ each independently represents a hydrogen atom, an alkyl group having 1 to 4 carbon atoms, or an aralkyl group represented by the following general formula (12), p and q are each independently an integer of 0 to 4 provided that either one of p and q is 1 or more, and $R^9$ each independently represents a hydrogen atom, an aralkyl group represented by the following general formula (12), or an epoxy group-containing aromatic hydrocarbon group represented by the following general formula (13); and in the above general formula (11), a bonding position to a naphthalene structure site may be either of two benzene rings constituting the naphthalene structure site,

[Formula 17]

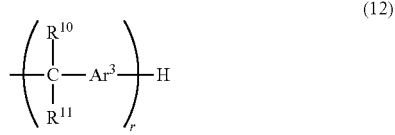

(12)

wherein $R^{10}$ and $R^{11}$ each independently represent a hydrogen atom or a methyl group, and $Ar^3$ represents a phenylene group, a phenylene group or a naphthylene group in which 1 to 3 hydrogen atoms are each replaced by an alkyl group having 1 to 4 carbon atoms, or a naphthylene group in which 1 to 3 hydrogen atoms are each replaced by an alkyl group having 1 to 4 carbon atoms; and r is a number of 0.1 to 4 on average,

[Formula 18]

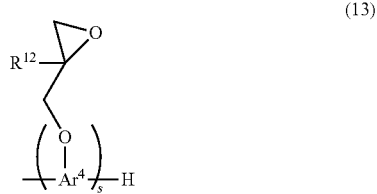

(13)

wherein $R^{12}$ represents a hydrogen atom or a methyl group, $Ar^4$ represents a naphthylene group or a naphthylene group having an alkyl group having 1 to 4 carbon atoms, an aralkyl group, or a phenylene group as a substituent, and s is an integer of 1 or 2.

The content of the epoxy resin (B) in the resin composition in this embodiment can be appropriately set according to the target application and performance, and is not particularly limited. In terms of the solvent solubility and heat resistance of the resin composition, and the like, the content of the epoxy resin (B) is preferably 10 to 90 parts by mass, more preferably 30 to 70 parts by mass, based on 100 parts by mass of the total of the cyanate compound (A) and the epoxy resin (B).

As the inorganic filler (C) used in the resin composition in this embodiment, a known one can be appropriately used, and the type of the inorganic filler (C) is not particularly limited. Generally, those used in resin compositions for printed wiring boards or for electrical wiring boards can be preferably used. Specific examples thereof include silicas, such as natural silica, fused silica, synthetic silica, amorphous silica, and hollow silica, white carbon, titanium white, AEROSIL, silicone composite powders, silicone resin powders, zinc oxide, magnesium oxide, zirconium oxide, boron nitride, aggregated boron nitride, silicon nitride, aluminum nitride, barium sulfate, aluminum hydroxide, heat-treated products of aluminum hydroxide (products obtained by heat-treating aluminum hydroxide to decrease some of the water of crystallization), boehmite, metal hydrates, such as magnesium hydroxide, molybdenum compounds, such as molybdenum oxide and zinc molybdate, zinc borate, zinc stannate, alumina, clay, kaolin, talc, calcined clay, calcined kaolin, calcined talc, natural mica, synthetic mica, E-glass, A-glass, NE-glass, C-glass, L-glass, D-glass, S-glass, M-glass G20, glass short fibers (including glass fine powders of E-glass, T-glass, D-glass, S-glass, Q-glass, and the like), hollow glass, and spherical glass. One of these can be used alone, or two or more of these can be used in appropriate combination according to the purpose. Among these, silica is preferred in terms of water absorbency.

The content of the inorganic filler (C) in the resin composition in this embodiment can be appropriately set according to the target application and performance, and is not particularly limited. In terms of a thermal expansion coefficient and moldability, the content of the inorganic filler (C) is preferably 10 to 300 parts by mass, more preferably 30 to 250 parts by mass, based on 100 parts by mass of the total of the resin solid components.

Here, the resin composition in this embodiment may contain a curing accelerator for appropriately adjusting curing speed, as required. As this curing accelerator, those generally used as curing accelerators for cyanate compounds and epoxy resins can be preferably used, and the type of the curing accelerator is not particularly limited. Specific examples thereof include, but are not particularly limited to, organometallic salts of copper, zinc, cobalt, nickel, and the like, imidazoles and derivatives thereof, and tertiary amines. One curing accelerator can be used alone, or two or more curing accelerators can be used in appropriate combination.

In addition, the resin composition in this embodiment may contain components other than the above in a range in which the expected characteristics are not impaired. Examples of such optional blending materials include various polymer compounds, such as other thermosetting resins other than the above cyanate compound (A) and epoxy resin (B), thermoplastic resins, and oligomers thereof, and elastomers, flame-retardant compounds, and various additives. These are not particularly limited as long as they are those generally used. Examples of the flame-retardant compounds include bromine compounds, such as 4,4'-dibromobiphenyl, phosphorus compounds, such as phosphates, melamine phosphate, and phosphorus-containing epoxy resins, nitrogen-containing compounds, such as melamine and benzoguanamine, oxazine ring-containing compounds, and silicone-based compounds. Examples of the various additives include, but are not particularly limited to, a curing catalyst, a silane coupling agent, an ultraviolet absorbing agent, an antioxidant, a photopolymerization initiator, a fluorescent brightening agent, a photosensitizer, a dye, a pigment, a thickening agent, a flow adjusting agent, a lubricant, a defoaming agent, a dispersing agent, a wetting and dispersing agent, a leveling agent, a brightening agent, and a polymerization inhibitor. One of these optional blending materials can be used alone, or two or more of these optional blending materials can be used in combination.

The resin composition in this embodiment may contain an organic solvent as required. In other words, the resin composition in this embodiment can be used as a mode (varnish) in which at least some, preferably all, of the above-described cyanate compound (A) and epoxy resin (B) are dissolved in or compatible with an organic solvent. As the organic solvent, a known one can be appropriately used as long as it is one capable of dissolving or making compatible at least some, preferably all, of the cyanate compound (A) and the epoxy resin (B). The type of the organic solvent is not particularly limited. Specific examples thereof include, but are not particularly limited to, ketones, such as acetone, methyl ethyl ketone, methyl isobutyl ketone, and cyclohexanone, aromatic hydrocarbons, such as benzene, toluene, and xylene, and amides, such as dimethylformamide and dimethylacetamide. One organic solvent can be used alone, or two or more organic solvents can be used in appropriate combination.

The resin composition in this embodiment can be prepared according to an ordinary method, and the preparation method is not particularly limited. The resin composition in this embodiment can be easily prepared by stirring and mixing the above-described cyanate compound (A), epoxy resin (B), inorganic filler (C), and the like. Examples thereof include a method of blending the inorganic filler (C) in the epoxy resin (B), dispersing this by a homomixer or the like, and further blending the cyanate compound (A) therein. Here, during preparation of the resin composition, it is desired to add an organic solvent in order to decrease viscosity to improve handling properties and enhance impregnation properties into glass cloth. During preparation of this resin composition, known treatment (stirring, mixing, and kneading treatment and the like) for uniformly mixing the components can be performed. The above stirring, mixing, and kneading treatment can be appropriately performed, for example, using a known apparatus, such as an apparatus intended for mixing, such as a ball mill or a bead mill, or a revolution and rotation mixing apparatus, or a dispersion apparatus.

On the other hand, a prepreg in this embodiment is obtained by combining the above resin composition in this embodiment with a substrate, specifically, impregnating or coating a substrate with the above resin composition. This prepreg can be made according to an ordinary method, and the making method is not particularly limited. For example, the prepreg in this embodiment can be made by impregnating or coating a substrate with a varnish obtained by adding an organic solvent to the above resin composition, and then heating the substrate with the varnish in a dryer at 100 to 200° C. for 1 to 60 minutes, or the like for semi-curing (B-staging). At this time, the amount of the resin composition adhered to the substrate, that is, the amount of the resin composition (including the inorganic filler (C)) based on the total amount of the prepreg after the semi-curing, is preferably in the range of 20 to 95% by mass.

The substrate used in the prepreg in this embodiment is not particularly limited, and can be appropriately selected and used from among, for example, known ones used for various printed wiring board materials, depending on the target application and performance. Specific examples thereof include, but are not particularly limited to, woven cloths of glass fibers of E-glass, T-glass, L-glass, D-glass, S-glass, NE-glass, Q-glass, UN-glass, spherical glass, and the like, inorganic fibers of materials other than glass, such as quartz, organic fibers of polyimides, polyamides, polyesters, and the like, and liquid crystal polyesters. One substrate can be used alone, or two or more substrates can be used in appropriate combination. As the shape of the substrate, woven cloths, nonwoven cloths, rovings, chopped strand mats, surfacing mats, and the like are known, and as the weave of the woven cloth, plain weave, basket weave, twill weave, and the like are known. Any may be used. In addition, the thickness of the substrate is not particularly limited, and is usually about 0.01 to 0.3 mm, and is, for example, preferably in the range of 0.01 to 0.2 mm in laminate applications. In addition, materials surface-treated with a silane coupling agent or the like, and woven cloths subjected to physical opening treatment can be preferably used in terms of moisture absorption and heat resistance properties. In addition, films of polyimides, polyamides, polyesters, and the like can also be used as the substrate. The thickness of these films is not particularly limited, and is preferably about 0.002 to 0.05 mm. Further, films surface-treated by plasma treatment or the like, and films surface-treated with a silane coupling agent or the like can also be preferably used. Among these substrates, particularly, glass fibers of E-glass are preferably used in laminate applications because of the balance between the expansion coefficient in the planar direction and workability.

On the other hand, a laminate in this embodiment is obtained by lamination and molding using the above-described prepreg. In addition, a metal foil-clad laminate in this embodiment is obtained by lamination and molding using the above-described prepreg and metal foil. Specifically, the metal foil-clad laminate in this embodiment can be made by stacking one or a plurality of the above-described prepregs, disposing metal foil of copper, aluminum, or the like on one surface or both surfaces of the stack as desired, and laminating and molding them. The metal foil used here is not particularly limited as long as it is one used for a printed wiring board material. Copper foil, such as rolled copper foil and electrolytic copper foil, is preferred. Considering conductor loss in the high frequency region, electrolytic copper foil having small matte surface roughness is more preferred. In addition, the thickness of the metal foil is not particularly limited, and is preferably 2 to 70 µm, more preferably 2 to 35 µm. As the molding conditions, usual methods for laminates and multilayer plates for printed wiring boards can be applied. For example, molding is generally performed at a temperature in the range of 100 to 300° C. and a surface pressure in the range of 2 to 100 kgf/cm$^2$ with a heating time in the range of 0.05 to 5 hours using a multistage press, a multistage vacuum press, a continuous molding machine, an autoclave molding machine, or the like. In addition, a multilayer plate can also be provided by laminating and molding the above prepreg and a separately made wiring board for an inner layer in combination. Specifically, for example, a multilayer plate can be made by disposing copper foil on both surfaces of one of the above prepreg, laminating and forming them under the above conditions, then forming inner layer circuits, subjecting the circuits to blackening treatment to form an inner layer circuit board, then alternately disposing the inner layer circuit boards and the above prepregs one by one, further disposing copper foil on the outermost layers, and laminating and molding them under the above conditions preferably under vacuum.

The above metal foil-clad laminate in this embodiment can be preferably used as a printed wiring board by forming a predetermined wiring pattern. The metal foil-clad laminate in this embodiment has excellent flame resistance, a low water absorption rate, and excellent productivity, and therefore can be especially effectively used as a printed wiring board for a semiconductor package of which such performance is required.

The above printed wiring board can be produced, for example, by the following method. First, a metal foil-clad laminate, such as the above-described copper-clad laminate, is prepared. Next, a surface of the metal foil-clad laminate is subjected to etching treatment to form an inner layer circuit to make an inner layer board. The inner layer circuit surface of this inner layer board is subjected to surface treatment for enhancing adhesive strength, as required. Then, the required number of the above-described prepregs are stacked on the inner layer circuit surface, metal foil for an outer layer circuit is further laminated on the outside of the stack, and the laminate is heated and pressurized for integral molding. In this manner, a multilayer laminate in which an insulating layer comprising a substrate and a cured product of a thermosetting resin composition is formed between an inner layer circuit and metal foil for an outer layer circuit is produced. Then, this multilayer laminate is subjected to perforation for through holes and via holes, and then, a plated metal film that allows conduction between the inner layer circuit and the metal foil for an outer layer circuit is formed on the wall surface of this hole. Further, the metal foil for an outer layer circuit is subjected to etching treatment to form an outer layer circuit, and a printed wiring board is produced.

In this manner, a printed wiring board comprising an insulating layer and a conductor layer formed on a surface of this insulating layer can have a configuration in which the insulating layer comprises the resin composition in this embodiment described above. Specifically, for example, in the printed wiring board shown in the above production example, the prepreg in this embodiment described above (the substrate and the resin composition in this embodiment with which the substrate is impregnated or coated), and the resin composition layer of the metal foil-clad laminate in this embodiment described above (the layer comprising the resin composition in this embodiment) are composed of an insulating layer comprising the resin composition in this embodiment.

EXAMPLES

The present invention will be described in more detail below by giving Examples and Comparative Examples, but the present invention is not limited in any way by these Examples. "Parts" indicates "parts by mass" unless otherwise specified below.

Synthesis Example 1

Synthesis of Cyanate Compound Obtained by Cyanation of Phenol-Modified Xylene Formaldehyde Resin (NIKANOL GLP) (Cyanate of Following General Formula (Ia) (Having Following Formula (14) as Typical Composition): Hereinafter Abbreviated as GLPC)

[Formula 19]

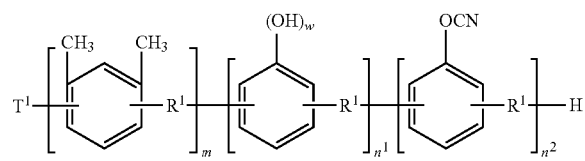

(Ia)

wherein $R^1$, $T^1$, w, m, $n^1$, and $n^2$ have the same meanings as those described in the above-described general formula (I).

[Formula 20]

Synthesis of Phenol-Modified Xylene Formaldehyde Resin (NIKANOL GLP)

800 g (8.5 mol) of phenol and 0.43 g of PTSA (para-toluenesulfonic acid), a catalyst, were charged, and stirred and heated, and 670 g of a xylene formaldehyde resin (NIKANOL G, manufactured by Fudow Company Limited) was dropped at a liquid temperature of 130° C. over 1 hour. During the dropping, the reflux temperature decreased from 150° C. to 105° C. The reaction was completed in 1 hour after the dropping. After the reaction, steam distillation was carried out at 170° C. for 2.5 hours for phenol removal. Then, 1700 g of methyl isobutyl ketone was gradually added with cooling, to dilute the reaction liquid. Then, the diluted reaction liquid was repeatedly washed with 850 g of hot water at 70 to 80° C. 3 times.

Next, solvent removal and distilling off of unreacted phenol were performed by a distillation operation to obtain 1130 g of a phenol-modified xylene formaldehyde resin represented by the following general formula (Ia'). The OH value of the obtained phenol-modified xylene formaldehyde resin was obtained based on JISK1557-1, and was 314 mg KOH/g.

[Formula 21]

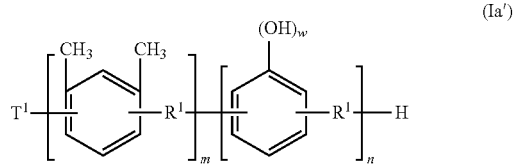

(Ia')

wherein $R^1$, $T^1$, w, and m have the same meanings as those described in the above-described general formula (I), and n has the same meaning as $n^2$ described in the above-described general formula (I).

Synthesis of Cyanate of Phenol-Modified Xylene Formaldehyde Resin (GLPC)

20 g of the phenol-modified xylene formaldehyde resin (NIKANOL GLP) represented by the general formula (Ia') (0.112 mol of OH groups) obtained by the above method and 17.13 g (0.168 mol) of triethylamine were dissolved in 120 g of methylene chloride (a solution 1). The solution 1 was dropped into a solution obtained by stirring and mixing 48.1

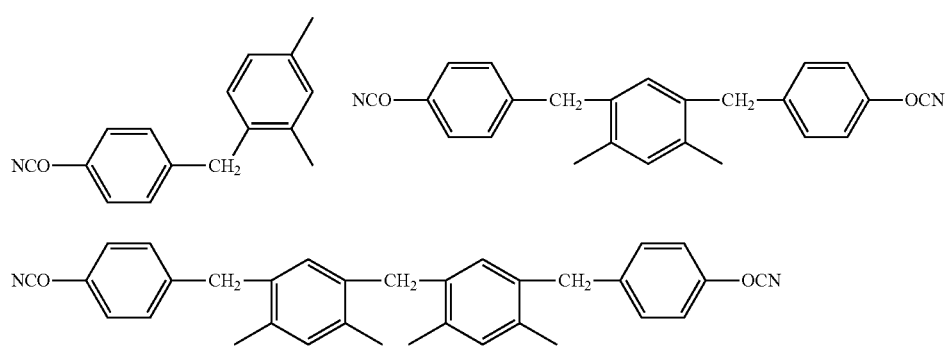

(14)

g of a methylene chloride solution of 0.249 mol of cyanogen chloride, 23.76 g (0.235 mol) of 36% hydrochloric acid, and 147.3 g of water at −5 to +5° C. over 10 minutes. The mixture was stirred for 30 minutes. Then, a mixed solution of 11.42 g (0.112 mol) of triethylamine and 11.4 g of methylene chloride was dropped, and further, the mixture was stirred for 30 minutes to complete the reaction. The reaction liquid was separated, and the organic phase was fractionated. The obtained organic phase was washed with 100 g of water 4 times, and then, the methylene chloride was distilled off by distillation to obtain 23.1 g of the target cyanate of a phenol-modified xylene formaldehyde resin (GLPC) represented by the above formula (Ia) as a yellow-red viscous material.

It was possible to dissolve 30% by mass or more of the compound in methyl ethyl ethyl ketone at 25° C. In addition, the viscosity was measured using a rheometer AR2000EX manufactured by TA Instruments, and the viscosity of the compound was 0.4 Pa·s at 100° C. Measurement was performed by GPC, and the weight average molecular weight (Mw) of the compound was 1050.

Synthesis Example 2

Synthesis of Cyanate Compound obtained by Cyanation of 2,6-Xylenol-Modified Xylene Formaldehyde Resin (Cyanate of Following General Formula (Ib) (Having Following Formula (15) as Typical Composition): Hereinafter Abbreviated as NXDC)

[Formula 22]

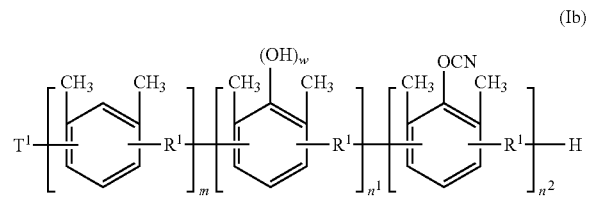

(Ib)

wherein $R^1$, $T^1$, w, m, $n^1$, and $n^2$ have the same meanings as those described in the above-described general formula (I).

[Formula 23]

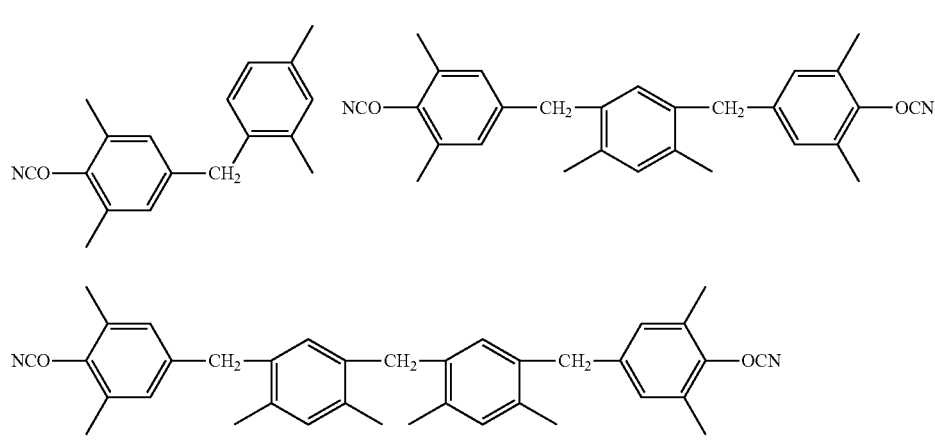

(15)

Synthesis Method of 2,6-Xylenol-Modified Xylene Formaldehyde Resin 486.8 g (3.99 mol) of 2,6-xylenol and 6.3 g of PTSA (para-toluenesulfonic acid), a catalyst, were charged, and stirred and heated, and at a point when a liquid temperature of 125° C. was reached, 144 g of a xylene formaldehyde resin (NIKANOL GL16, manufactured by Fudow Company Limited) was dropped over 1 hour. During the dropping, the heating was continued, and the reaction was completed in 3 hours at 150° C. After the reaction, the reaction liquid was cooled to 120° C. or less. 160 g of meta-xylene was added to the reaction liquid, and then, 240 g of methyl isobutyl ketone was added to dilute the reaction liquid. Then, the diluted reaction liquid was repeatedly washed with 400 g of hot water at 70 to 80° C. 3 times.

Next, solvent removal and distilling off of unreacted 2,6-xylenol were performed by a distillation operation to obtain 362 g of a crude product of a 2,6-xylenol-modified xylene formaldehyde resin represented by the following formula (Ib'). A mixture obtained by adding 300 g of meta-xylene to 292 g of the obtained crude product was stirred and dissolved on a hot water bath (some crystals remained), and cooled with ice water with continuous stirring to precipitate crystals. Then, a filtration operation was performed by a G-3 filter to remove the crystals. Further, the solvent was distilled off from the filtrate by a distillation operation to obtain 175 g of a purified product of the 2,6-xylenol-modified xylene formaldehyde resin represented by the following general formula (Ib'). The OH value of the obtained 2,6-xylenol-modified xylene formaldehyde resin was obtained based on JISK1557-1, and was 318 mg KOH/g.

[Formula 24]

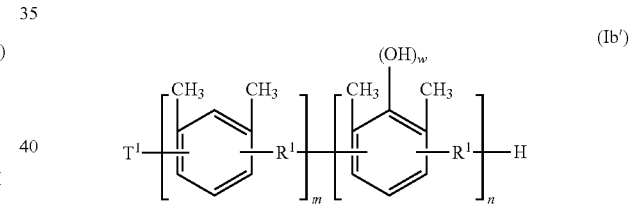

(Ib')

wherein $R^1$, $T^1$, w, and m have the same meanings as those described in the above-described general formula (I), and n has the same meaning as $n^2$ described in the above-described general formula (I).

Synthesis of Cyanate of 2,6-Xylenol-Modified
Xylene Formaldehyde Resin (NXDC)

256 g of the purified product of the 2,6-xylenol-modified xylene formaldehyde resin represented by the general formula (Ib') (1.45 mol of OH groups) obtained by the above method and 1.6 mol of triethylamine were dissolved in 600 mL of 3-methyltetrahydrofuran (a solution 2). Then, the solution 2 was dropped into 500 g of a methylene chloride solution of 2.8 mol of cyanogen chloride at −10° C. over 1.5 hours. The mixture was stirred for 30 minutes. Then, a mixed solution of 0.8 mol of triethylamine and 115 g of methylene chloride was dropped, and further, the mixture was stirred for 30 minutes to complete the reaction. Then, the hydrochloride of triethylamine was filtered off from the reaction liquid, and the obtained filtrate was washed with 1000 mL of 0.1 N hydrochloric acid, then further washed with 1000 mL of an aqueous NaCl solution 3 times, and finally washed with 1000 mL of water. The obtained methylene chloride solution was dried with sodium sulfate, and methylene chloride was distilled off by a distillation operation to obtain 240 g of the target cyanate of a 2,6-xylenol-modified xylene formaldehyde resin (NXDC) represented by the above formula (Ib) as a yellow-red viscous material.

It was possible to dissolve 30% by mass or more of the compound in methyl ethyl ethyl ketone at 25° C. In addition, the viscosity was measured using a rheometer AR2000EX manufactured by TA Instruments, and the viscosity of the compound was 0.3 Pa·s at 100° C. Measurement was performed by GPC, and the weight average molecular weight (Mw) of the compound was 650.

Comparative Synthesis Example 1

Synthesis of Biphenyl Aralkyl-Based Cyanate Compound 0.50 Moles of a biphenyl aralkyl-based phenolic resin (KAYAHARD GPH65, manufactured by Nippon Kayaku Co., Ltd.) was dissolved in 500 ml of chloroform, and then, 0.75 mol of triethylamine was added and mixed. 300 g of a chloroform solution in which 1.0 mole of cyanogen chloride was dissolved was dropped into the mixture at −10° C. over 1.5 hours. The mixture was stirred for 30 minutes. Then, a mixed solution of 0.1 moles of triethylamine and 30 g of chloroform was dropped, and further, the mixture was stirred for 30 minutes to complete the reaction. Then, the produced hydrochloride of triethylamine was filtered off from the reaction liquid, and the obtained filtrate was washed with 500 mL of 0.1 N hydrochloric acid, and then further repeatedly washed with 500 mL of water 4 times. This was dried with sodium sulfate, and then concentrated to obtain crystals. The obtained crystals were washed with 1000 mL of n-hexane, and then dried under reduced pressure to obtain a biphenyl aralkyl-based cyanate. It was confirmed that as a result of infrared absorption spectrum measurement, in the biphenyl aralkyl-based cyanate compound obtained in this manner, an absorption spectrum at 3200 to 3600 $cm^{-1}$ due to the phenolic OH group disappeared, and the biphenyl aralkyl-based cyanate compound had an absorption spectrum around 2264 $cm^{-1}$ due to the nitrile of the cyanate.

Example 1

50 Parts by mass of the GLPC obtained in Synthesis Example 1 was dissolved in methyl ethyl ketone, and then, 50 parts by mass of a phenol biphenyl aralkyl-based epoxy resin (NC3000-H, manufactured by Nippon Kayaku Co., Ltd.) also dissolved in methyl ethyl ketone was mixed to prepare a resin composition. It was visually confirmed that this resin composition of only resins was transparent, and was in a state in which the resins were dissolved in the solvent. Next, 150 parts of spherical synthetic silica (SC-2050MR, manufactured by Admatechs Company Limited) was mixed with this resin composition, and 0.04 parts by mass of zinc octylate was further mixed to prepare a resin composition (varnish).

The varnish obtained in this manner was diluted with methyl ethyl ketone. An E-glass cloth having a thickness of 0.1 mm was impregnated and coated with the diluted varnish, and heated and dried at 165° C. for 10.5 minutes to make a prepreg having a resin content of 37% by mass. Next, four of the prepregs were stacked, and electrolytic copper foil having a thickness of 18 μm was disposed on both surfaces of the obtained laminate. The laminate with the electrolytic copper foil was subjected to vacuum pressing at a pressure of 30 $kgf/cm^2$ and a temperature of 220° C. for 120 minutes for lamination and forming to make a metal foil-clad laminate (both surface copper-clad laminate) having an insulating layer thickness of 0.4 mm. The measurement results of the properties of the obtained both surface copper-clad laminate are shown in Table 1.

Example 2

Operation was performed as in Example 1 except that instead of 50 parts by mass of the GLPC, 50 parts by mass of the NXDC obtained in Synthesis Example 2 was used. It was visually confirmed that the varnish of only resins was transparent, and was in a state in which the resins were dissolved in the solvent. The measurement results of the properties of the obtained both surface copper-clad laminate are shown in Table 1.

Comparative Example 1

Operation was performed as in Example 1 except that instead of 50 parts by mass of the GLPC, 50 parts by mass of a prepolymer of 2,2-bis(4-cyanatephenyl)propane (CA210, manufactured by MITSUBISHI GAS CHEMICAL COMPANY, INC.) was used. It was visually confirmed that the varnish of only resins was transparent, and was in a state in which the resins were dissolved in the solvent. The measurement results of the properties of the obtained both surface copper-clad laminate are shown in Table 1.

Comparative Example 2

Operation was performed as in Example 1 except that instead of 50 parts by mass of the GLPC, 50 parts by mass of a phenol novolac-based cyanate compound (Primaset PT-30, manufactured by Lonza) was used. It was visually confirmed that the varnish of only resins was transparent, and was in a state in which the resins were dissolved in the solvent. The measurement results of the properties of the obtained both surface copper-clad laminate are shown in Table 1.

Comparative Example 3

Operation was performed as in Example 1 except that instead of 50 parts by mass of the GLPC, 50 parts by mass of the biphenyl aralkyl-based cyanate compound obtained in Comparative Synthesis Example 1 was used. This biphenyl aralkyl-based cyanate obtained in Comparative Synthesis Example 1 was not dissolved in methyl ethyl ketone, and the varnish of only resins was in a state in which insoluble matter was suspended also after stirring a mixer. But, spherical synthetic silica and the like were added to the varnish of only resins as it was to prepare a varnish, and impregnation and coating for a glass cloth was similarly performed. The measurement results of the properties of the obtained both surface copper-clad laminate are shown in Table 1.

TABLE 1

|  | Example 1 | Example 2 | Comparative Example 1 | Comparative Example 2 | Comparative Example 3 |
|---|---|---|---|---|---|
| Water absorption rate (wt %) | 0.3 | 0.3 | 0.5 | 0.5 | 0.4 |
| Flame resistance | 94V-0 | 94V-0 | 94V-1 | 94V-0 | 94V-0 |
| Solvent solubility of resins | Dissolved | Dissolved | Dissolved | Dissolved | Cyanate was insoluble |

(Measurement Methods)

After the copper foil of the copper-clad laminate was removed by etching, evaluation of water absorbency and flame resistance was performed.

1) Water absorption rate: Evaluation was performed according to JIS-C6481 using a sample obtained by cutting the obtained both surface copper-clad laminate to a size of 50 mm×50 mm×0.4 mm by a dicing saw, and removing all the copper foil on both surfaces by etching. Specifically, first, weight after drying at 50° C. for 24 hours was measured (W0), and then, weight after water absorption at 121° C. and 2 atmospheres for 3 hours using a pressure cooker tester (manufactured by HIRAYAMA MANUFACTURING CORPORATION, model PC3) was measured (W1). The water absorption rate was calculated based on the following formula.

water absorption rate (wt %)=100×(W1−W0)/W0

2) Flame resistance: A flame resistance test was carried out according to the UL94 vertical burning test method using a sample obtained by cutting the obtained both surface copper-clad laminate to a size of 13 mm×130 mm×0.4 mm by a dicing saw, and removing all the copper foil on both surfaces by etching.

As is clear from Table 1, it was confirmed that the resin compositions of Examples 1 and 2 had excellent solvent solubility and excellent handling properties and productivity. In addition, it was confirmed that the prepregs and the laminates made using the resin compositions of Examples 1 and 2 not only had significantly low water absorbency but also sufficiently excellent flame resistance compared with Comparative Examples 1 to 3.

This application claims priority from Japanese Patent Application No. 2011-267935 filed with the Japan Patent Office on Dec. 7, 2011, the content of which is incorporated herein by reference.

INDUSTRIAL APPLICABILITY

As described above, the present invention can be widely and effectively used in lamination materials, buildup laminate materials, and the like, and can be especially effectively used particularly in applications where low water absorbency, high flame resistance, and the like are required, for example, printed wiring boards addressing higher density.

The invention claimed is:

1. A prepreg resin composition comprising at least a cyanate compound (A) obtained by cyanation of a phenol-modified xylene formaldehyde resin, an epoxy resin (B), and an inorganic filler (C), and wherein 30 to 70 parts by mass of the cyanate compound (A) is contained based on 100 parts by mass of a total of the (A) component and the (B) component, wherein 30 to 70 parts by mass of the epoxy resin (B) is contained based on 100 parts by mass of the total of the (A) component and the (B) component, wherein the weight average molecular weight Mw of the cyanate compound (A) is 250 to 10,000, wherein the cyanate compound (A) is at least one selected from the group consisting of the cyanate compound having a structure represented by the following general formula (Ia) and the cyanate compound having a structure represented by the following general formula (Ib),

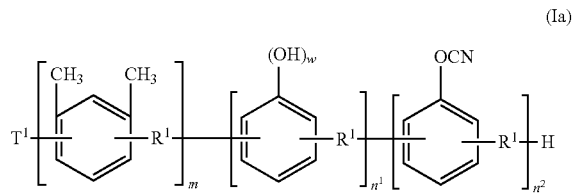

wherein, in the formula (Ia), $R^1$ each independently represents a methylene group, a methyleneoxy group, a methyleneoxymethylene group, or an oxymethylene group, $T^1$ represents a hydrogen atom, a hydroxyl group, or a hydroxymethylene group, w represents an integer of 0 or 1, m represents an integer of 0 or more, and $n^1$ and $n^2$ each independently represent an integer of 1 or more,

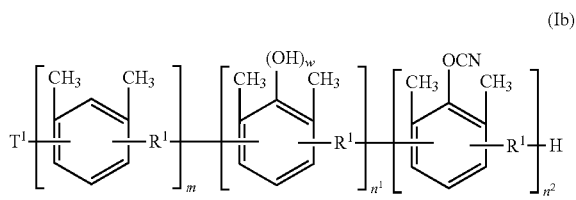

wherein, in the formula (Ib), $R^1$ each independently represents a methylene group, a methyleneoxy group, a methyleneoxymethylene group, or an oxymethylene group, $T^1$ represents a hydrogen atom, a hydroxyl group, or a hydroxymethylene group, w represents an integer of 0 or 1, m represents an integer of 0 or more, and $n^1$ and $n^2$ each independently represent an integer of 1 or more, wherein the epoxy resin (B) is a biphenyl aralkyl-based epoxy resin represented by the following general formula (10),

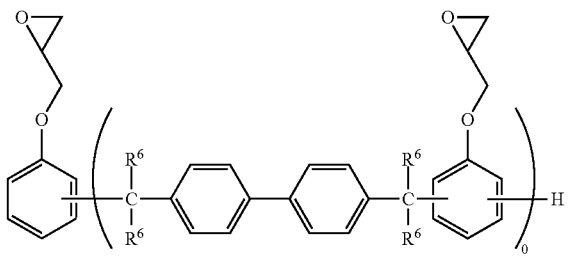

wherein R⁶ each independently represents a hydrogen atom or a methyl group, and o represents an integer of 1 to 50.

2. The prepreg resin composition according to claim 1, wherein the inorganic filler (C) is silica.

3. The prepreg resin composition according to claim 1, wherein 10 to 300 parts by mass of the inorganic filler (C) is contained based on 100 parts by mass of the total of the (A) component and the (B) component.

4. A prepreg obtained by impregnating or coating a substrate with the prepreg resin composition according to claim 1.

5. A laminate comprising a plurality of the prepregs according to claim 4 that are laminated.

6. A metal foil-clad laminate comprising the prepreg according to claim 4 and metal foil laminated on the prepreg.

7. A printed wiring board comprising the laminate according to claim 6.

8. A printed wiring board comprising an insulating layer and a conductor layer formed on a surface of the insulating layer, wherein the insulating layer comprises the prepreg resin composition according to claim 1.

* * * * *